United States Patent [19]

Ludwick et al.

[11] Patent Number: 4,739,196
[45] Date of Patent: Apr. 19, 1988

[54] WIDE RANGE LINEAR INPEDANCE CONTROLLER USING JUNCTION FIELD EFFECT TRANSISTORS

[75] Inventors: John J. Ludwick, Hampton; Edward S. Parsons, Londonderry, both of N.H.

[73] Assignee: American Telephone and Telegraph Company, AT&T Bell Laboratories, Murray Hill, N.J.

[21] Appl. No.: 867,063

[22] Filed: May 27, 1986

[51] Int. Cl.[4] .............................................. H03K 5/08
[52] U.S. Cl. ................................... 307/490; 307/264; 307/499; 307/501; 307/568
[58] Field of Search ............... 307/490, 491, 499, 501, 307/264, 555, 568, 560, 304

[56] References Cited

U.S. PATENT DOCUMENTS 3,621,284 11/1971 Cluett et al. ........................ 307/568

FOREIGN PATENT DOCUMENTS 3226339 2/1983 Fed. Rep. of Germany ...... 307/490

*Primary Examiner*—John Zazworsky
*Attorney, Agent, or Firm*—Richard B. Havill

[57] ABSTRACT

A controller includes a pair of field-effect transistors interconnected so that their drain-to-source paths are electrically in a parallel circuit combination. The field-effect transistors have similar characteristics except that their minimum drain-to-source impedances are different from each other. An equivalent impedance of the parallel circuit combination is controlled by the gate-to-source voltages of the field-effect transistors. An input signal having a wide range is applied to a control circuit for producing concurrently different magnitude control signals, each of which is applied across the gate-to-source input of a separate one of the field-effect transistors for controlling its drain-to-source impedance over its most linear operating range.

9 Claims, 4 Drawing Sheets

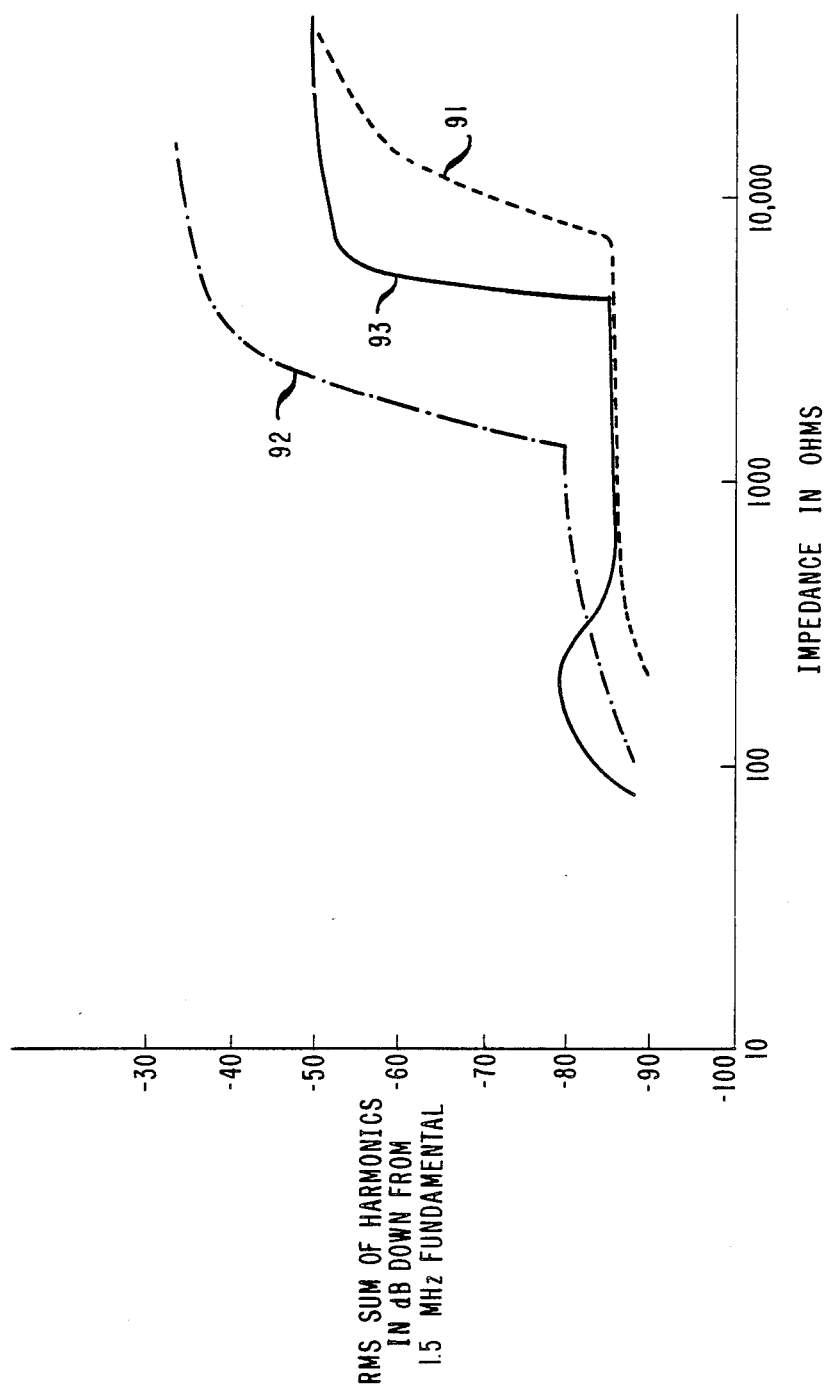

4,739,196

WIDE RANGE LINEAR INPEDANCE CONTROLLER USING JUNCTION FIELD EFFECT TRANSISTORS

BACKGROUND OF THE INVENTION

This invention relates to a controller which may be described more particularly as a wide range linear impedance controller using junction field-effect transistors as the control element.

In digital telecommunication transmission systems, cable length is too long for end-to-end signal transmission without equalization, amplification, and regeneration at designated points along the cable. Regenerators are required to offset the effects of attenuation, as a function of frequency, in the cable conductors. Typical regenerator circuitry includes an automatic line build-out (ALBO) circuit. The function of the ALBO circuit is to add shaped loss, if required, to the cable section so that the regenerator fixed gain equalizer can compensate for a predetermined loss shape. If the cable section is short, most of the loss shape is provided by the ALBO circuit. For a maximum length cable section, the ALBO circuit has minimal effect on the loss shape.

Required magnitude of the adjustable shaped loss covers a wide range because of variables in the design of any specific transmission line. The connected cable section may vary from short to long. Attenuation per unit length of the transmission medium varies from cable to cable. Ambient temperature varies over a wide range from day-to-day and season-to-season. Since the above-mentioned parameters, such as the length of the cable, the attenuation per unit length of the transmission medium, and the ambient temperature, determine the overall attenuation of the signal, it is desirable to provide an automatically adjustable shaped loss circuit with a wide enough dynamic range to provide the desired shaped loss characteristic, regardless of the input cable length, to the fixed gain equalizer.

In some prior art line regenerators, a string of diodes has been used to provide a variable control impedance for the ALBO circuit in dependence upon the variation of the magnitude of the input signal to the regenerator. Such a string of diodes has an insufficient dynamic range for state-of-the-art transmission systems.

Another drawback to the prior art arrangement is that it requires a fairly substantial magnitude of power supply voltage to achieve the dynamic range needed for linear operation. Linear operation means signal processing with a minimum amount of harmonic distortion. Since the power supply voltage is limited along a transmission line, the number of diodes used in series is limited and results in too little dynamic range for practical purposes.

Another prior art controller includes a single field-effect transistor (FET) for providing a variable impedance controlled by the magnitude of the input signal. The field-effect transistor, however, is inherently nonlinear over a wide impedance range. Part of the operating range is linear or nearly linear while another part of the operating range is very nonlinear. Unfortunately the linear part of the operating range is too limited to provide the wide range linear control required by the regenerators used in state-of-the-art transmission systems.

Thus, there is a problem in designing a wide range linear impedance controller for the regenerators to be used in state-of-the-art transmission systems.

SUMMARY OF THE INVENTION

The aforementioned problem is solved by a controller which includes a pair of junction field-effect transistors interconnected so that their drain-to-source impedances are electrically in a parallel circuit combination. The junction field-effect transistors have similar characteristics ecxept that their minimum drain-to-source impedances are different from each other. An equivalent impedance of the parallel circuit combination is controlled by the gate-to-source voltages applied to the junction field-effect transistors. An input signal, derived from the signal received from the cable, is applied to a JFET control driver circuit for producing concurrently different magnitude control signals, each of which is applied across the gate-to-source input of a separate one of the junction field-effect transistors for controlling its drain-to-source impedance over its relatively linear operating range.

BRIEF DESCRIPTION OF THE DRAWING

A better understanding of the invention may be derived by reading the subsequent detailed description with refernece to the attached drawing wherein:

FIG. 7 is a plot of linearity in terms of total harmonic distortion.

DETAILED DESCRIPTION

Figure 1:
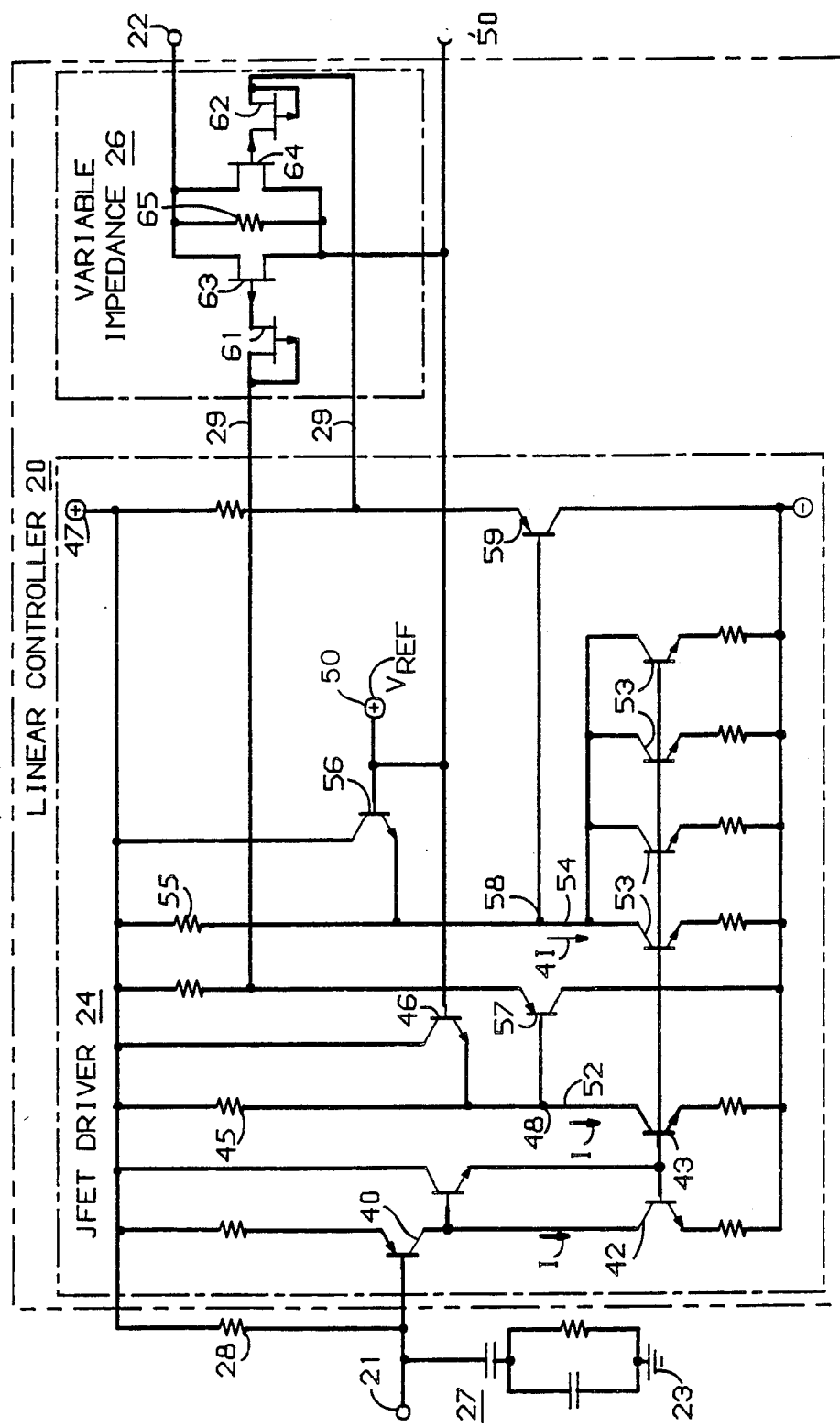
FIG. 1 is a schematic diagram of a wide range linear impedance controller.

Referring now to FIG. 1, there is shown a controller 20 which is responsive to an input control signal on an input lead 21 for producing a controlled junction field-effect transistor (JFET) impedance at an output terminal 22. The input control signal is applied between the input terminal 21 and ground reference 23. At the output, the controlled JFET impedance is produced between output terminal 22 and a reference voltage $V_{REF}$.

Controller 20 includes two major circuit configurations. One of those configurations is a JFET control driver 24 that is responsive to the input control signal on lead 21 for producing JFET control signals. In the exemplary embodiment of FIG. 1, there are two JFET control signals produced by the JFET control signal driver 24 on the leads 29. The second circuit configuration is a variable impedance arrangement 26, that responds to the JFET control signals to produce substantially linear operation over a wide range impedance which provides loss to signals applied on the terminal 22.

The magnitude of the input control signal applied to the input lead 21 is a relatively stable or constant signal which falls within a relatively wide range of values.

Width of the range of signal magnitudes is determined by the attenuation per unit length of a cable section, the length of that cable section, the ambient temperatures surrounding the cable section, and the performance of preceding ALBO and fixed gain equalizer circuits leading to the input lead 21. Most likely the input control signal between the lead 21 and ground reference will fall in a range of 4.0–7.0 volts. The exact range of the actual voltage does not matter. It is important, however, to control the signal at the output of the fixed-gain equalizer circuit to a prescribed amplitude that is independent of the magnitude of the input signal to the regenerator. Typically, the effective gain in the ALBO and fixed-gain equalizer circuits is increased as the magnitude of the input signal to the regenerator is reduced and vice versa.

An input filter 27 and a resistor 28 are connected with the input lead 21 for smoothing variations of the input signal.

A common-emitter connected transistor 40 is arranged for receiving on its base electrode the input signal occurring on the input lead 21. In response to variation of the input voltage, the transistor 40 produces a variable collector current I which is conducted into the input leg of a current mirror including transistors 42 and 43. The transistors 42 and 43 are designed alike so that the collector output current I of the transistor 43 has a magnitude equal to the magnitude of the input current I conducted into the collector of the transistor 42.

Current I, which is conducted to the collector of the transistor 43, also is conducted through a resistor 45 having a clamping transistor 46 connected thereacross. Voltage drop across the resistor 45 varies with the magnitude of current conducted therethrough. A bias supply 47 applies a voltage to one end of the resistor 45. All of the current I is conducted through the resistor 45 while the magnitude of the current I is low. When the magnitude of current I is large enough for the resulting voltage drop across the resistor 45 to turn on the transistor 46, that transistor limits any further increase in the current I through the resistor 45. As a result, a node 48 is clamped at a potential which is 0.7 volts below the voltage $V_{REF}$. The purpose of the clamping action that the transistor 46 provides is to avoid forward biasing the gate junctions of junction field-effect transistors 63 and 64 to be described. Without the clamp, a large voltage at the regenerator input would cause such low voltages on leads 21 and 29 that the gate junctions of the junction field-effect transistors 63 and 64 would defuse. When the current I is low, the potential at the node 48 generally varies with the magnitude of the input control signal until node 48 reaches the potential which turns on the transistor 46. Then the potential at node 48 is held substantially constant for any further swing of the magnitude of the voltage applied to the input lead 21.

Figure 2:
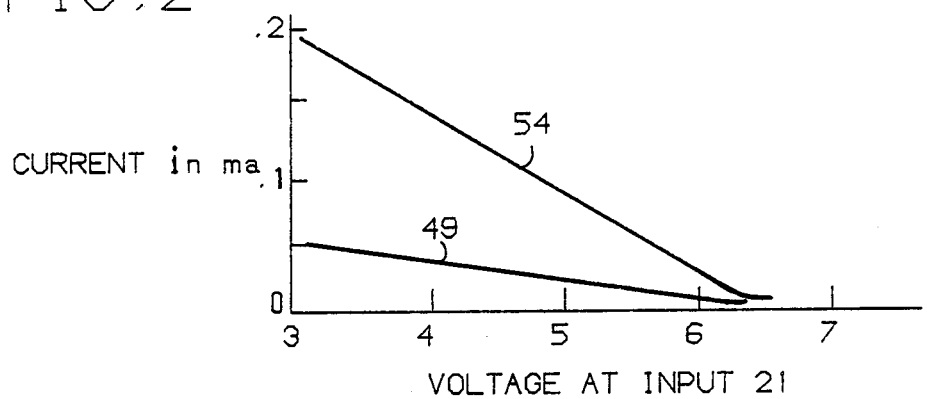
FIG. 2 is a plot of transfer characteristics showing currents conducted through separate paths in the controller in response to the input signal to the controller.

Referring now to FIG. 2, there is shown a transfer characteristic 49 from the magnitude of the voltage applied to the input lead 21 to the magnitude of the current I conducted through the lead 52 of FIG. 1. It is noted that the magnitude of the current I increases inversely with respect to the magnitude of the input control signal between the input lead 21 and reference ground 23 in FIG. 1.

In FIG. 1 another current source includes four transistors 53 which are connected as legs of the current mirror. The collectors of the transistors 53 are connected in a multiple arrangement to a common lead 54 which supplies current nI=4I (ie., n=4) to a resistor 55 and a clamping transistor 56. Resistor 55 and transistor 56 are arranged to operate similar to the resistor 45 and transistor 46 just described. Because of the multiple current source arrangement, current supplied in the lead 54, has a magnitude equal to four times (n=4) the magnitude of the current I. In FIG. 2 there is a transfer characteristic 54 from the magnitude of the voltage applied to the input terminal 21 to the magnitude of the current 4I in FIG. 1.

In the exemplary configuration, the resistors 45 and 55 have equal resistance. For small magnitudes of current, the currents I and 4I at the nodes 48 and 58, respectively, are conducted entirely through the resistors 45 and 55.

Figure 3:
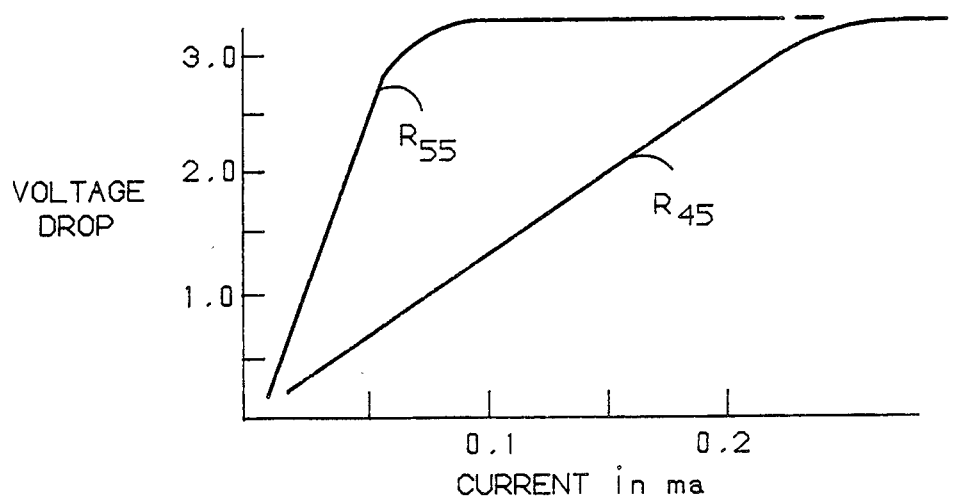
FIG. 3 is a plot of voltage drops produced across resistors in the controller.

FIG. 3 presents curves showing the voltage drops produced across the resistors 45 and 55, respectively, in response to the magnitudes of the currents that they conduct. In operation, the voltages produced on the nodes 48 and 58 in FIG. 1 are determined by the bias voltage 47 less the drop across the relevant resistor. As previously mentioned, the clamping transistors 46 and 56 limit the lowest possible voltages to insure that the junction field-effect transistors are not damaged.

Figure 4:
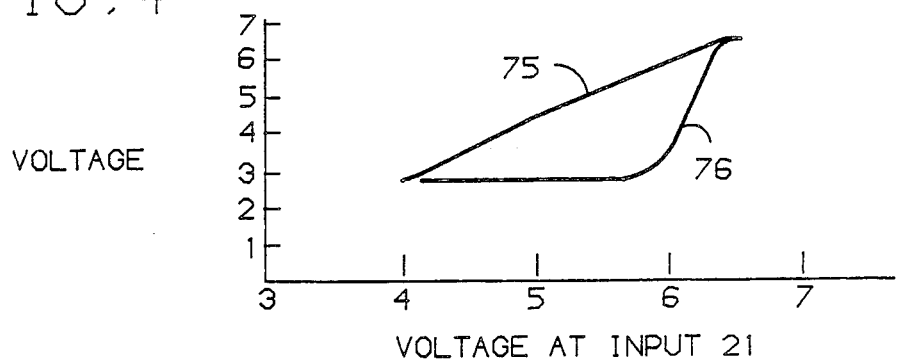
FIG. 4 is a plot of voltages produced at separate nodes in the controller in response to the input signal which is applied to the controller.

Referring now to FIG. 4, there is shown transfer characteristic curves 75 and 76 for the voltages at the nodes 48 and 58, respectively, as a function of the input control signal applied on the lead 21 of FIG. 1.

In FIG. 1, a pair of transistors 56 and 59, arranged as emitter-followers, transfer the voltages produced on the nodes 48 and 58, respectively, through the pair of leads 29 as JFET control signals. These JFET control signals are applied to separate inputs of the variable impedance arrangement 26. The variable impedance arrangement 26 includes four junction field-effect transistors (JFETs) 61, 62, 63, and 64. JFETs 61 and 62 are diode connected and are arranged as high impedance gating devices between the leads 29 and the input gate electrodes of the JFETs 63 and 64, respectively. Drain-to-source paths of the JFETs 63 and 64 and a resistor 65 are connected in a parallel circuit combination between reference voltage $V_{REF}$ at terminal 50 and the output terminal 22. Resistor 65 is included to limit the dynamic impedance range of the JFETs 63 and 64.

A wide range equivalent impedance is produced by the parallel circuit combination of the JFETs 63 and 64. Both JFETs 63 and 64 have like characteristics, both physical and electrical, except that they are designed to have different minimum drain-to-source impedances. These different minimum drain-to-source impedances are achieved by different gate widths. For the exemplary embodiment, the minimum drain-to-source impedances of the JFETs 63 and 64 are selected to be R=100 ohms and 4R=400 ohms, respectively. Generally, the larger minimum drain-to-source impedance should be at least twice (i.e., 2R) the value of the smaller minimum drain-to-source impedance so that their resulting individual impedances are different for any given input voltage applied to the lead 21.

Figure 5:
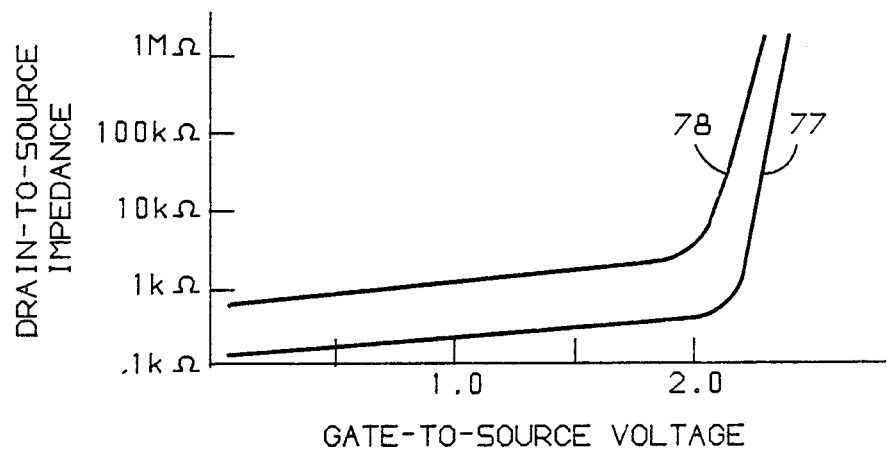
FIG. 5 is a plot of the drain-to-source impedances of junction field-effect transistors used in the controller.

In FIG. 5, there is shown for the JFETs 63 and 64 relevant impedance curves 77 and 78 as a function of their respective input gate-to-source voltages. As shown in FIG. 5, the JFETs 63 and 64 produce high drain-to-source impedances in response to high gate-to-source voltages and minimum drain-to-source impedances in response to low gate-to-source voltages.

Figure 6:
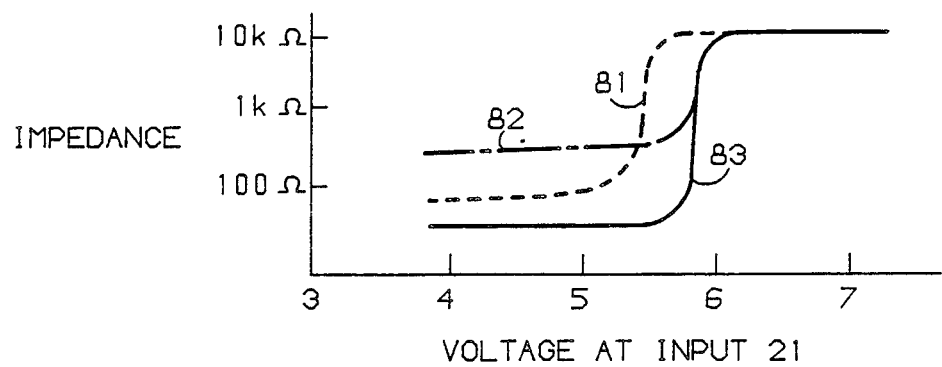
FIG. 6 is a plot of the individual impedances and of the equivalent impedance of the parallel circuit combination of the junction field-effect transistors as a function of the input signal which is applied to the controller.

In FIG. 6, the variable impedances 81 and 82 of the JFETs 63 and 64 together with the variable equivalent impedance 83 of the parallel circuit combination are shown as functions of the input control signal voltage applied to the input lead 21 of FIG. 1. The equivalent impedance presented between the terminals 22 and 50 of FIG. 1, is relatively linear over a wide range of the input voltage.

Referring now to FIG. 7, there are shown impedance curves 91, 92 and 93 versus the RMS sum of harmonies for the 100 ohm JFET by itself 91, for the 400 ohm JFET by itself 92, and by the combination impedance 93 including the 100 and 400 ohm JFETs in parallel with the resistor. Total harmonic distortion down 60 dB is better than the minimum acceptable nonlinearity for a digital line regenerator. The drain-to-source impedances of the JFETs control the combination impedance in different ranges of the input voltage. The curves represent harmonic distortion expected to be typical for a digital line regenerator having a peak-to-peak, drain-to-source signal voltage less than or equal to 300 millivolts.

The current conducted through the output lead 22, and a load, not shown in FIG. 1, also varies linearly. Variations of the output current are in response to any variation of the input control signal applied to the input lead 21. Signal linearity extends over a range that exceeds the range of either of the JFETs 63 and 64, individually.

Although the foregoing exemplary embodiment uses a four-to-one current ratio (n=4) and equal value resistors 45 and 55, other combinations are also useful. Useful current ratios fall both above (i.e., n>4) and below (i.e., n<4) the four-to-one ratio of the example. Resistors 45 and 55 may also be selected to have different resistances. Fr instance, in another useful system, the current ratio can be chosen to be one-to-one (i.e., n=1) and the resistance values for the resistors 55 and 45 selected to have a ratio of four-to-one. The resulting control signals will have a similar four-to-one ratio.

Generally the beneficial effects are realized with a combination of resistance values and current ratios such that the resulting control signals have a ratio of at least two-to-one (i.e., n≧2).

The foregoing describes several embodiments of the subject invention. The described embodiments together with other embodiments made obvious in view thereof are considered to be within the scope of the appended claims.

What is claimed is:
1. A controller comprising
a first field-effect transistor having a first control electrode and a controllable drain-to-source impedance,
a second field-effect transistor having a second control electrode and a controllable drain-to-source impedance,
means interconnecting the drain-to-source impedances of the first and second field-effect transistors in an electrically parallel circuit combination between an output terminal and a bias supply,
means for receiving an input signal having a range,
a control circuit responsive to the input signal for producing a first control signal that is applied to the first control electrode for controlling drain-to-source impedance of the first field-effect transistor in a linear portion of its characteristic during a first part of the range of the input signal, and
the control circuit further responsive to the input signal for producing a second control signal that is applied to the second control electrode for controlling the drain-to-source impedance of the second fieldeffect transistor in a linear portion of its characteristic during a second part of the range of the input signal.

2. A controller, in accordance with claim 1 wherein, the first and second field-effect transistors are similar to each other except that each field-effect transistor has a different minimum drain-to-source impedance.

3. A controller, in accordance with claim 2, wherein the first and second field-effect transistors produce high drain-to-source impedances in response to high gate-to-source voltages and minimum drain-to-source impedances in response to low gate-to-source voltages.

4. A controller, in accordance with claim 3, wherein the parallel circuit combination of the drain-to-source impedances of the first and second field-effect transistors produces a relatively wide range of linear impedance in response to variation of the input signal.

5. A controller, in accordance with claim 1, wherein the control circuit includes
a first resistor and a first current source conducting a variable magnitude current I through the first resistor,
a second resistor and a second current source conducting a variable magnitude current nI through the second resistor, n is a number other than zero,
a first output circuit for producing the first control signal in response to the voltage drop across the first resistor, and
a second output circuit for producing the second control signal in response to the voltage drop across the second resistor.

6. A controller, in accordance with claim 5, wherein the first and second resistors have substantially equal resistances, and
the second control signal has a magnitude that is n times the magnitude of the first control signal.

7. A controller in accordance with claim 5, wherein the first and second resistors have different resistances, and
the first and second control signals cause the first and second field-effect transistors to present a combined linear drain-to-source impedance over a wide input signal range.

8. A controllable impedance comprising
a first junction field-effect transistor having a first control electrode and a controllable drain-to-source impedance having a minimum magnitude R,
a second junction field-effect transistor having a second control electrode and a controllable drain-to-source impedance having a minimum magnitude of at least twice R,
means for interconnecting the drain-to-source impedances of the first and second junction field-effect transistors in an electrically parallel circuit combination between an output terminal and a bias supply, and
the parallel circuit combination producing a substantially linear impedance in response to different control signals applied between the first and second control electrodes and the drain electrodes of the first and second field-effect transistors.

9. A controllable impedance comprising a first field-effect transistor having a first control electrode and a controllable drain-to-source impedance having a minimum magnitude R, a second field-effect transistor having a second control electrode and a controllable drain-to-source impedance having a minimum magnitude at least twice R, means for interconnecting the drain-to-source impedances of the first and second field-effect transistors in an electrically parallel circuit combination between an output terminal and a bias supply, and the parallel circuit combination has an equivalent impedance that is linear over a greater dynamic range than the dynamic range of linearity of a drain-to-source impedance of a single field-effect transistor.

* * * * *